United States Patent [19]

Ootuki

[11] Patent Number: 5,494,713
[45] Date of Patent: Feb. 27, 1996

[54] METHOD FOR TREATING SURFACE OF ALUMINUM MATERIAL AND PLASMA TREATING APPARATUS

[75] Inventor: Hayashi Ootuki, Yamanashi, Japan

[73] Assignee: Tokyo Electron Limited, Tokyo, Japan

[21] Appl. No.: 383,232

[22] Filed: Feb. 3, 1995

[30] Foreign Application Priority Data

Feb. 3, 1994 [JP] Japan .................................. 6-033091

[51] Int. Cl.⁶ .................................................. C23C 14/14
[52] U.S. Cl. ...................... 427/579; 118/723 R; 427/294; 427/419.2; 427/419.7; 427/585; 156/345; 205/201; 205/203
[58] Field of Search ..................................... 427/579, 585, 427/294, 419.2, 419.7; 204/181.2; 118/723 R

*Primary Examiner*—Bernard Pianalto
*Attorney, Agent, or Firm*—Oblon, Spivak, McClelland, Maier, & Neustadt

[57] ABSTRACT

An alumite coating film is formed on a surface of an aluminum electrode by anodic oxidation. Pores formed on the alumite coating film are sealed. Thereafter, a silicon nitride film is formed on a surface of the alumite coating film by plasma CVD. In a plasma etching apparatus using the aluminum electrode on which the alumite coating film and the silicon nitride film are sequentially layered, HBr/HCl gas is used as process gas to perform plasma etching of a wafer. An active radical generated from HBr/HCl etches the wafer and attacks the aluminum electrode. Since the aluminum electrode is protected with the silicon nitride film, an aluminum substrate and the alumite coating film are prevented from being etched. Therefore, impurity materials of the aluminum substrate and the alumite coating film are not dispersed into the chamber of the plasma etching apparatus. As a result, the wafer can be prevented from being contaminated by the impurity materials.

12 Claims, 2 Drawing Sheets

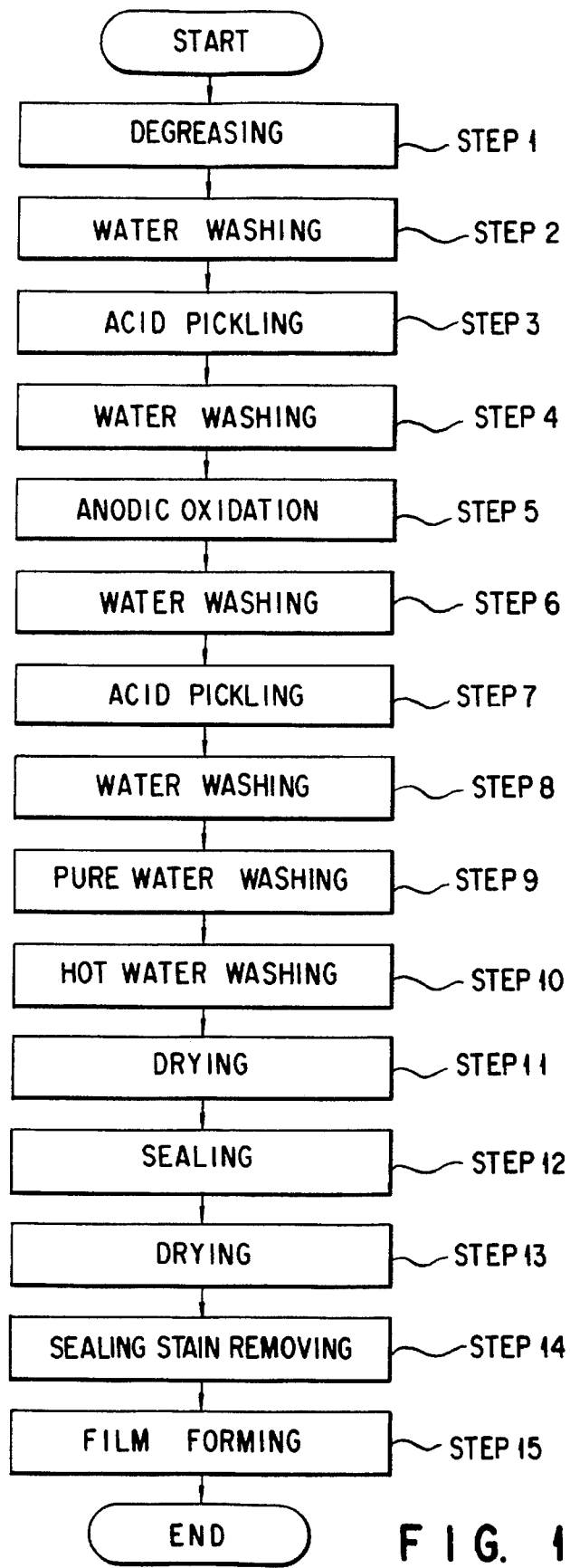
F I G. 1

METHOD FOR TREATING SURFACE OF ALUMINUM MATERIAL AND PLASMA TREATING APPARATUS

BACKGROUND OF THE INVENTION

1. Field of the Invention

The present invention relates to a method for treating a surface of aluminum material and a plasma treating apparatus using such material, and particularly to a method for treating a surface of aluminum material contacting corrosion gas and a plasma treating apparatus using aluminum material whose surface is treated.

2. Description of the Related Art

A plasma treating apparatus has been used in an etching process, which is one of the manufacturing processes of a semiconductor device. As a plasma treating apparatus, there is a parallel plate type plasma treating apparatus comprising a mount electrode on which a treating object is mounted and an opposite electrode provided to be opposite to the mount electrode.

By use of such a plasma treating apparatus, the following plasma etching of a treating object is performed. More specifically, the treating object is mounted on a surface of the mount electrode. In this state, high-frequency power is applied onto the mount electrode and/or the opposite electrode to generate plasma between these electrodes. In plasma, components of etching gas are dissociated, and an active radical is generated. The surface of the treating object is etched by the active radical.

As an electrode material in the above-mentioned plasma treating apparatus, high-purity aluminum containing a little amount of impurity material is suitably used. However, such high-purity aluminum is expensive. Moreover, since mechanical strength of high-purity aluminum is low, high-purity aluminum is easily broken in processing high-purity aluminum as an electrode. Due to this, in order to overcome the economical reason and ensure the mechanical strength necessary for processing, aluminum containing a certain degree of impurity material, e.g., impurity material of 2 to 3 wt %, has been used as electrode material. Moreover, for the same reason, aluminum material containing a small amount of impurity material has been used in other materials of the plasma treating apparatus such as a chamber. As impurity materials contained in such aluminum, for example, heavy metals such as iron, chrome, nickel, copper, etc. are included.

The electrode and the chamber, which are formed of such aluminum containing impurity material (hereinafter called as aluminum material), are etched during plasma etching. Particles or the atom of aluminum and the impurity material are dispersed into the chamber by etching. These particles or the atoms are mixed with a thin film formed in the treating object such as a semiconductor wafer, and the so-called heavy metal contamination may be caused.

In order to solve this problem, in conventional, anodic oxidation is provided on the surface of aluminum, and the surface of aluminum is coated with an alumite coating film. The alumite coating film has resistance to corrosion, and high hardness as compared with aluminum. Whereby, etching of the aluminum material in the plasma etching treatment is controlled to prevent particles or the atom of aluminum and the impurity material from being splashed from the aluminum material.

However, the alumite coating film, as such, is slightly etched by plasma etching. Therefore, there is a case in which the alumite coating film is etched in the plasma treatment and the material contained in the alumite coating film is splashed into the chamber. As a result, even if the alumite coating film is formed on the surface of the aluminum material the generation of heavy metal contamination of the treating object cannot be completely prevented.

Conventionally, carbon tetrachloride ($CCl_4$) gas is mainly used in etching, for example, polycrystalic silicone. However, since $CCl_4$ gas has strong toxicity, and environmental pollution is considered, the use of $CCl_4$ is regulated. Due to this, in place of $CCl_4$ gas, there is a tendency to use mixing gas of hydrogen bromine (HBr)/hydrogen chloride (HCl).

HBr/HCl gas has higher corrosive than $CCl_4$. Due to this, the alumite coating film, which is formed on the surface of the aluminum material, is more etched with Br/HCl gas as compared with the case of using $CCl_4$ gas. Therefore, the incidence of the particles, the atom or the like of aluminum and the impurity material, which are dispersed from the alumite coating film, in the case of the plasma etching treatment using HBr/HCl gas is higher than the case of the plasma etching treatment using $CCl_4$. Due to this, the heavy metal contamination of the treating object may be easily generated.

Moreover, the alumite coating film takes in moisture, etc. when being formed by anodizing aluminum. When a inside of the chamber is made various, in which the aluminum material is placed, the water or the like in the alumite coating film are discharged into atmosphere in the chamber. This phenomenon is called as "outgas". If outgas is occurred, vacuum degree in the chamber of the plasma treating apparatus or concentration of process gas, or the component is changed. As a result, there occurs a case in which a desired plasma generation condition cannot be obtained and even treatment cannot be provided onto the surface of the treating object. In order to prevent generation of gas from the alumite coating film, the aluminum material, which is formed on the surface of the alumite coating film, is conventionally baked to generate gas compulsorily. However, since a clack is generated on the alumite coating film by the generation of gas, the alumite coating film is peeled off, and the particles of alumite are generated, such a treatment is unfavorable.

SUMMARY OF THE INVENTION

An object of the present invention is to provide a method for treating a surface of aluminum material wherein aluminum and impurity materials of aluminum or alumite can be prevented from being dispersed into atmosphere when a surface of aluminum material is etched in a plasma treatment, and a treating object can be prohibited from being contaminated, and to provide a plasma treating apparatus using aluminum material whose surface is treated by the surface treating method.

According to the first aspect of the present invention, there is provided a method for treating a surface of aluminum material, comprising the steps of forming an anodic oxide coating film on the surface of aluminum material by anodic oxidation; sealing pores formed on the anodic oxide coating film by the anodic oxidation treatment; and forming a silicon coating film on a surface of the anodic oxide coating film by plasma CVD after the sealing treatment.

Also, according to the second aspect of the present invention, there is provided a plasma treating apparatus comprising a chamber; a mount electrode provided in the chamber; an opposite electrode provided in the chamber so as to be opposite to the mount electrode; process gas supplying means for supplying process gas to the chamber; and a high-frequency power source for supplying a high frequency to at least one of the mount electrode and the opposite electrode, wherein when at least one of the mount electrode and the opposite electrode is made of aluminum, an anodic oxide film and a silicon coating film are sequentially layered on a surface of the aluminum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a flow chart showing each step of one embodiment of surface of an aluminum material treating method of the present invention.

DETAILED DESCRIPTION OF THE PREFERRED EMBODIMENT

Figure 2:
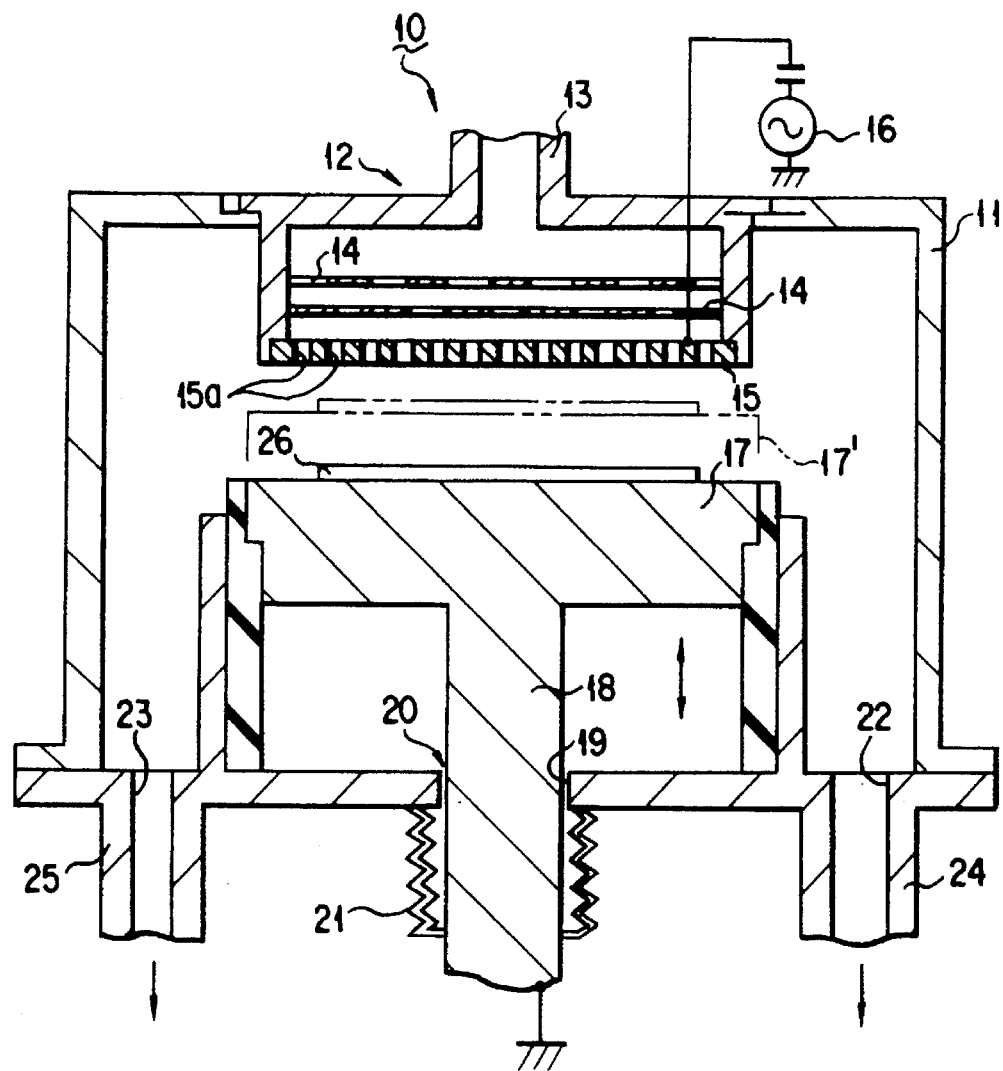
FIG. 2 is a schematic view showing one embodiment of a plasma treating apparatus using an aluminum material obtained by the surface treating method of FIG. 1.

Embodiments of the present invention will be explained with reference to the drawings.

FIG. 1 is a flow chart showing each step of one embodiment of surface of an aluminum treating method of the present invention.

This example explains a case in which an opposite electrode, which is used in a parallel plate type plasma etching treating apparatus for the manufacture of a semiconductor device, is formed.

First, a disk like aluminum substrate having a diameter of 200 mm, and a thickness of 3 mm is prepared. A large number of openings having a diameter of about 0.8 mm are formed to the aluminum substrate. The aluminum substrate is made of aluminum. Hereinafter, a term of "aluminum" should understand as both pure aluminum and aluminum alloy. The aluminum substrate is degreased in accordance with conventional procedure (Step 1 of FIG. 1). For example, the degreasing treatment is carried by use of degreasing agent containing surface-active agent such as alkaline aqueous solution. More specifically, the aluminum substrate is dipped in solution containing the surface-active agent at temperature of 50° to 60° C. for a few minutes. As a result, grease adhered onto the surface of the aluminum substrate is removed.

Next, the aluminum substrate is washed with water to remove chemical liquid used in the degreasing treatment (Step 2). In the water washing treatment, for example, the aluminum substrate is dipped with tap water for a few minutes.

After the water washing treatment is ended, the aluminum substrate is washed with acid pickling solution (Step 3). In the acid pickling treatment, for example, the aluminum substrate is dipped with nitrate solution having concentration of 30 to 40% and temperature of 50° to 60° C. for a few seconds.

After the acid pickling treatment is ended, the aluminum substrate is washed with water again to move acid pickling solution adhered onto the aluminum substrate (Step 4). The water washing treatment is carried out in the same as in step 2.

Next, anodic oxidation is provided onto the surface of the aluminum substrate whose surface was cleaned as mentioned above (Step 5). In other words, the aluminum substrate is used as an anode and the current supply is performed in a state that the aluminum substrate is dipped in a predetermined electrolyte. As a result, an oxide film, that is, an alumite coating film is formed on the surface of the aluminum substrate, which contain inner surface of the openings.

The above anodic oxidation can be carried out by the well known method. More specifically, for example, sulfuric acid having concentration of about 15% is used as electrolyte. The current is supplied between the aluminum substrate, which is the anode, and a cathode such as carbon for 1.5 to 2.0 hours under conditions that temperature of the electrolyte is about 0° C. and density of current is 3 to 4 A/dm$^2$. Whereby, an anodic oxide coating film, i.e., alumite coating film, having a thickness of 70 to 80 µm is formed on the surface of the aluminum substrate. A large number of pores is formed in a surface layer section of the alumite coating film.

Then, the aluminum substrate is washed with water to remove electrolyte adhered onto the surface of the aluminum substrate (Step 6). In the water washing treatment, for example, the aluminum substrate is dipped with tap water for a few minutes.

After the water washing treatment, the aluminum substrate is washed with the acid pickling solution again (Step 7). In this case, for example, nitrate solution having concentration of about 3 to 4% and and temperature of 40° to 60° C. is used. The aluminum substrate is washed with the acid pickling solution e.g., for one to three seconds. Whereby, impurity materials deposited on the pores of the alumite coating film that is, copper (Cu), which is naturally contained in aluminum material can be removed.

After the acid pickling treatment, the aluminum substrate is washed with tap water for a few minutes (Step 8). After the water washing treatment, the aluminum substrate is washed with pure water for a few minutes (Step 9). Further, the aluminum substrate is washed with hot pure water, which is obtained by heating pure water at 80° to 90° C., for a few minutes to carry out a washing treatment with hot water (Step 10). By the washing treatments in steps 8 to 10, the impurity materials, which are adhered onto the pores of the alumite substrate, and acid pickling solution, which is used to remove the impurity materials, are substantially completely removed.

Thereafter, the aluminum substrate is dried (Step 11). More specifically, for example, the aluminum substrate is heated by a heating oven at 80° C. for 30 minutes.

After the above drying treatment is ended, a sealing treatment is provided to the aluminum substrate (Step 12). The sealing treatment is provided to seal the pores in the surface layer section of the alumite coating film. In the sealing treatment, the aluminum substrate is left for about one hour under conditions of pressure of 3 to 5 kg/cm$^2$ and pressure steam of temperature of 120° to 140° C. As a result, the pores of the alumite coating film are sealed. However, since the alumite coating film is left in the elevated pressure atmosphere, stains are formed on the coating surface.

After the sealing treatment is ended, the aluminum substrate is naturally left to be dried (Step 13). Next, the surface of the alumite coating surface is wiped with a cloth, which is made met with hot water so as to remove stain formed in the above sealing treatment (Step 14).

Then, a film forming treatment is provided to the aluminum substrate, on whose surface the alumite coating film is formed through steps 1 to 14 (Step 15). Thus, a silicon coating film is formed on the surface of the alumite coating film. The silicon coating film is such as silicon oxide (SiO$_2$) or silicon nitride (SiN$_2$). Also, each of the inner peripheral surface of the openings of the aluminum substrate is coated by the silicon coating film.

The silicon coating film is formed by the well known plasma chemical vapor deposition (plasma CVD). For example, for forming a SiO$_2$ film, tetraethoxyoxysilane (TEOS) and oxygen (O$_2$) are used as source gas. The conditions of CVD are set as follows:

The surface temperature of the aluminum substrate of 200° to 300° C., pressure of several tens mTorr, and film forming speed of about 100 Å/min.

Also, for forming the SiO$_2$ film, silane (SiH$_4$) gas and ammonia (HN$_3$) gas are used. The temperature of the aluminum substrate is preferably 350° C. or less than. Therefore, according to the plasma CVD method, the heating temperature of the aluminum substrate may be below melting temperature i.e., 470° to 640° C. of the aluminum substrate to form the film.

Moreover, it is desirable that the thickness of the silicon coating film be 10 μm or less than, preferably about 5 μm. Since the aluminum coating film, the alumite coating film, and the silicon coating film differ in coefficient of linear expansion, a crack is easily generated when the thickness of the silicon coating film is increased too much. On the other hand, if the thickness of below 5 μm is unfavorable since the protection of the aluminum substrate and that of the alumite coating film cannot be sufficiently performed.

As explained above, the alumite coating film and the silicon coating film are sequentially layered on the surface of the aluminum substrate, thereby obtaining the opposite electrode. The silicon coating film has high resistance to corrosion in plasma etching as compared with the alumite coating film. Table 1 shows the etching rate of each of the alumite coating film, various kinds of silicon coating films in plasma etching using HBr/HCl as etching gas:

TABLE 1

| Coating Film | Etching Rate |
| --- | --- |
| Alumite | 0.2 μm/H |
| SiO$_2$ | 0.02 μm/H |
| SiN$_2$ | 0.07 μm/H |
| Etching Condition | |
| Etching Gas | HBr/HCl = 200/20 SccM |
| Rf power | 275 W |
| Rf frequency | 13.56 MHz |
| Mode | P |
| Pressure | 600 mTorr |
| Electrode distance | 6 mm |

Therefore, according to the present invention, the opposite electrode made of aluminum, to which the surface treatment is provided, the aluminum substrate and the alumite coating film are protected by the silicon coating film during the plasma etching. Therefore, it is prevented that particles or atoms or aluminum, alumite or the impurity materials such as Fe, Cu, Cr, Ni, etc., are dispersed from the aluminum substrate or the alumite coating film into the atmosphere of the chamber of the plasma etching apparatus. As a result, contamination of the surface of the treating object can be reduced. Moreover, purity of the silicon coating film is extremely high, and impurity materials are little contained therein. Due to this, even if the silicon coating film is slightly etched by plasma etching, the particles or the atoms of impurity materials are little dispersed into the chamber.

Table 2 shows the amount of aluminum contamination on the the surface of the silicon wafer, which is formed on the surface of the silicon wafer, is etched by plasma etching in the case of each of the following aluminum electrodes is used:

(1) The aluminum electrode to which normal anodic oxidation is provided; and (2) the aluminum electrode in which silicon nitride (SiN$_2$) is formed on the surface of the alumite coating film formed by providing the anodic oxidation according to the embodiment of the present invention.

TABLE 2

| | Coating Film | Amount of Aluminum Pollution |
| --- | --- | --- |
| (1) Prior Art | Alumite | 5 × 10$^{12}$ atomg/cm$^2$ |
| (2) Present Invention | Alumite/SiN$_2$ | 5 × 10$^{11}$ atomg/cm$^2$ |
| Etching Condition | | |
| Etching Gas | HBr/HCl = 200/20 SccM | |
| Rf power | 275 W | |
| Rf frequency | 13.56 MHz | |
| Mode | P | |
| Pressure | 600 mTorr | |
| Electrode distance | 6 mm | |

As being obvious from FIG. 2, the aluminum electrode (2) in which the alumite coating film and SiN$_2$ coating film are formed on its surface was used as the opposite electrode, so that contamination on the surface of the silicon wafer was largely reduced. As a result, the following point was confirmed. Specifically, the silicon coating film is formed on the surface of the alumite coating film of the aluminum material, whereby contamination of the treating object, which is caused by aluminum, alumite or impurity materials contained in the aluminum substrate or the alumite coating film, in the plasma etching treatment can be prevented.

Moreover, since the alumite coating film of the aluminum electrode is coated with the silicon coating film. A phenomena of discharging gas from the alumite coating film, which is called as "outgas", can be controlled. Due to this, degree of vacuum in the chamber can be maintained, and generation of plasma can be stabilized. Even if gas is generated from the silicon coating film, which is the outermost layer, unfavorable influence is not exerted on the treating object since such gas is the similar material to the treating object in a case where the treating object, e.g., silicon wafer is silicon material.

According to the above-mentioned surface treating method, impurity materials can be substantially completely prevented from being dispersed from the aluminum electrode. Therefore, it is unnecessary to increase degree of purity of aluminum used as the electrode. As a result, the manufacturing cost of the parts of the plasma etching treating apparatus can be reduced.

Moreover, since the silicon coating film is formed by plasma CVD, the film forming is performed at lower temperature than the melting temperature of aluminum. Therefore, there is no possibility that the aluminum substrate will thermally deformed in the film forming treatment.

Furthermore, in the above-mentioned surface treating method, it can be considered that forming treatment is provided to the surface of the alumite coating film with a polishing composition to increase roughness of the surface of the alumite coating film, in order to prevent the silicon coating film from being peeled off. However, since the alumite coating film is largely damaged by the forming treatment and the roughness of the surface becomes too large, it is difficult for this method to be applied. Therefore, the surface of the aluminum substrate is degreased and washed, and the forming treatment is provided thereto with the polishing composition whose grain size is #100. Thereafter, the anodic oxidation is provided to the aluminum substrate, so that the alumite coating film is formed. Then, the surface of the alumite coating film is polished such that the roughness of the surface is set to about Rmax 1 µm or less than. Thereafter, the sealing treatment is provided to the alumite coating film, so that the silicon coating film is formed on the alumite coating film as described above. By this method, the peeling of the silicon coating film can be much reduced.

The above explained the example of the aluminum opposite electrode. However, this surface treating method can be applied to the aluminum materials used in the plasma treating apparatus other than the opposite electrode, for example, a mount electrode, a chamber, etc.

Also, the treating object of the plasma etching apparatus, which uses the aluminum material to which the above-mentioned surface treatment is provided, is, for example, polycrystalic silicon or the like formed on the surface of the silicon wafer. These materials are removed by plasma etching in a state that HBr/HCl is normally used as etching gas.

FIG. 2 explains a plasma treating apparatus using the aluminum opposite electrode obtained by the above-mentioned surface treating method. In FIG. 2, a shower head portion 12 is provided on a part of an upper wall surface of the process chamber 11. A pipe 13 for supplying etching gas is connected to an upper portion of the shower head portion 12. Two baffle plates 14 are provided in the shower head portion 12 to be parallel with each other. An opposite electrode 15 is provided in the lower portion of the shower head portion 12. In the opposite electrode 15, a large number of openings 15a having a diameter of 0.8 mm so as to discharge etching gas. The anodic oxide film (alumite coating film) and the silicon coating film are sequentially formed on the surface of aluminum substrate including each inner peripheral surface of the opening 15a in accordance with the above-explained surface treating method. A high-frequency (Rf) power source 16 is connected to the opposite electrode 15.

A mount electrode 17, serving as a suscepter to be opposite to the main surface, is provided on the lower side of the opposite electrode 15. The mount electrode 17 is movable up and down. A support rod 18, which is formed in the lower portion of the mount electrode 17, is projected to the outside of the process chamber 11 through an opening 19 formed on the wall surface of the lower portion of the process chamber 11. Driving means (not shown) is connected to a lower end portion of the support rod 18. It is noted that the Rf power source 16 may be connected to the mount electrode 17, and that the opposite electrode 15 may be grounded. Also, the Rf power source 16 may be connected to both the opposite electrode 15 and the mount electrode 17.

A bellows 21 is formed so as to airtightly close a gap 20 formed between the support rod 18 and the opening 19 of the process chamber 11.

On the other hand, one end portion of each of exhaust pipes 24 and 25, which are used to exhaust gas of the internal section of the process chamber 11, is connected to each of openings 22 and 23 formed on the wall surface of the lower portion of the process chamber 11. Exhausting means (not shown) is connected to the other end portion of each of the exhaust pipes 24 and 25.

By use of the above-structured plasma etching treating apparatus 10, polycrystalic silicon film, which is formed on the surface of a wafer 26, is etched as follows.

More specifically, first, the wafer 26 is mounted on the main surface of the upper side of the mount electrode 17. Then, the mount electrode 17 is moved up to a position shown by an imaginary line 17'. In this state, the internal section of the process chamber 11 is pressure-reduced by exhausting means connected to the exhaust pipes 24 and 25, so that degree of vacuum is set to, for example, 20 to 600 mTorr.

Next, etching gas, for example, HBr/HCl is supplied from the pipe 13. The supplied etching gas is divided by the baffle plate 14, and evenly discharged to the wafer 26 formed on the mount electrode 17 through the openings 15a of the opposite electrode 15.

Under this state, the high frequency is supplied to the opposite electrode 15 from the Rf power source 16, so that plasma is generated between the opposite electrode 15 and the mount electrode 17. In plasma, components of etching gas are dissociated, and an active radical is generated. Then, the surface of polycrystalic silicon film of the wafer 26 is etched by the active radical.

Also, the surface of the opposite electrode 15 is attacked by the active radical during plasma etching of the wafer 26. However, the surface of the aluminum substrate constituting the opposite electrode 15 is coated with the silicon coating film having high resistance to corrosion against plasma etching of HBr/HCl. The aluminum substrate and alumite coating film are not etched since they are protected by the silicon coating film. Therefore, it can be prevent that particles or atoms or aluminum, alumite and impurity materials such as Fe, Cu, Cr, Ni, etc., are dispersed into the atmosphere of the process chamber 11. As a result, contamination of the surface of the wafer 26, which is caused by the particles and the atoms, can be reduced. Moreover, the silicon coating film has extremely high degree of purity and contains little impurity materials. Due to this, even if the silicon coating film is slightly etched by plasma etching, the particles of impurity materials or the atoms are little dispersed into the chamber 11.

Since the alumite coating film, which is formed on the surface of the opposite electrode 15, is coated with the silicon coating film, the outgas phenomena, can be prevented from being occurred. Due to this, degree of vacuum of the chamber can be maintained, and generation of plasma can be stabilized. Even if gas is generated from the silicon coating film, which is the outermost layer, unfavorable influence is not exerted on the wafer 26 since such gas is the similar material to the wafer 26.

According to the above-mentioned plasma etching apparatus 10, impurity materials can be substantially completely prevented from being peeled off the aluminum electrode 15.

Due to this, it is unnecessary to increase degree of purity of aluminum. Therefore, the manufacturing cost of the parts of the plasma etching apparatus 10 can be reduced.

In the above-mentioned plasma etching apparatus 10, the above-mentioned surface treatment is provided to only the opposite electrode 15. However, it is possible to form the alumite coating film and the silicon coating film on the other aluminum materials, e.g., process chamber 11 and mount electrode 17. Moreover, the silicon coating film is formed on the surface of the part of the plasma etching apparatus or the other semiconductor manufacturing device, formed of material, which can be used as the silicon coating film, other than aluminum, and the part is etched by plasma etching, whereby the treating object can be prevented from being contaminated. As mentioned above, the same advantages as the above-explained embodiment of the present invention can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for treating a surface of aluminum material made of aluminum, comprising the steps of:

forming an anodic oxide coating film on the surface of aluminum material by anodic oxidation;

sealing pores formed on said anodic oxide coating film by said anodic oxidation treatment; and forming a silicon coating film on a surface of said anodic oxide coating film by plasma CVD after said sealing treatment.

2. A method according to claim 1, wherein a thickness of said silicon coating film is within 5 to 10 µm.

3. A method according to claim 1, wherein said silicon coating film is at least one selected from a group consisting of $SiO_2$ and $SiN_2$.

4. A method according to claim 1, wherein aluminum material is material to be used in a plasma treating apparatus.

5. A method according to claim 4, wherein said aluminum material is used as a mount electrode, an opposite electrode, and an inner wall material of a chamber of said plasma treating apparatus.

6. A method according to claim 1, wherein forming is provided to the surface of said aluminum material before said anodic oxidation.

7. A plasma treating apparatus comprising:

a chamber;

a mount electrode provided in said chamber;

an opposite electrode provided in said chamber so as to be opposite to said mount electrode;

process gas supplying means for supplying process gas to said chamber; and a high-frequency power source for supplying a high frequency to at least one of said mount electrode and said opposite electrode, wherein when at least one of said mount electrode and said opposite electrode is made of aluminum, an anodic oxide film and a silicon coating film are sequentially layered on a surface of said aluminum.

8. A plasma treating apparatus according to claim 7, wherein a thickness of said silicon coating film is within 5 to 10 µm.

9. A plasma treating apparatus according to claim 7, wherein said silicon coating film is at least one selected from a group consisting of $SiO_2$ and $SiN_2$.

10. A plasma treating apparatus according to claim 7, wherein a large number of openings is formed on said opposite electrode to supply process gas, and said anodic oxide film and said silicon coating film are formed on a surface of said opposite electrode including inner peripheral surfaces of these openings.

11. A plasma treating apparatus according to claim 7, wherein process gas is etching gas.

12. A plasma treating apparatus according to claim 11, wherein etching gas is HBr/HCl.

* * * * *